(12) United States Patent
Yamauchi et al.

(10) Patent No.: US 6,584,020 B2
(45) Date of Patent: Jun. 24, 2003

(54) SEMICONDUCTOR MEMORY DEVICE HAVING INTERMEDIATE VOLTAGE GENERATING CIRCUIT

(75) Inventors: Tadaaki Yamauchi, Hyogo (JP); Makoto Muneyasu, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 58 days.

(21) Appl. No.: 09/909,967

(22) Filed: Jul. 23, 2001

(65) Prior Publication Data

US 2002/0101773 A1 Aug. 1, 2002

(30) Foreign Application Priority Data

Feb. 1, 2001  (JP) ........................................ 2001-025135

(51) Int. Cl.[7] .............................................. G11C 16/04
(52) U.S. Cl. ................... 365/189.09; 365/201
(58) Field of Search ........................ 365/189.09, 201, 365/189.11, 207, 208

(56) References Cited

U.S. PATENT DOCUMENTS

| | | | | |
|---|---|---|---|---|
| 4,839,865 A | * | 6/1989 | Sato et al. | 365/201 |
| 5,255,232 A | * | 10/1993 | Foss et al. | 365/203 |
| 6,091,648 A | * | 7/2000 | Furutani et al. | 365/189.11 |

* cited by examiner

*Primary Examiner*—Richard Elms
*Assistant Examiner*—Anh Phung
(74) *Attorney, Agent, or Firm*—McDermott, Will & Emery

(57) ABSTRACT

In a bit line reference potential (VBL) generating circuit, a pad is connected via a transfer gate to a reference node in a reference stage. During a device evaluation test, the transfer gate is turned on in response to a test signal so that a voltage is applied to the reference node with a tester driver via the pad to control a potential of an output node in an output stage. Thus, the semiconductor memory device is capable of stably controlling the bit line reference potential VBL regardless of the drivability of the tester driver during the device evaluation test.

8 Claims, 9 Drawing Sheets

SEMICONDUCTOR MEMORY DEVICE HAVING INTERMEDIATE VOLTAGE GENERATING CIRCUIT

BACKGROUND OF THE INVENTION

1. Field of the Invention

The present invention relates to a semiconductor memory device, and more specifically, to a semiconductor memory device having an intermediate voltage generating circuit.

2. Description of the Background Art

FIG. 9 is a circuit diagram of a conventional bit line reference potential (hereinafter referred to as VBL) generating circuit.

As shown in FIG. 9, a VBL generating circuit includes an output stage 700 for outputting a bit line reference potential VBL to a bit line pair within a memory cell array via an equalizer (not shown), a reference stage 500 for controlling an MOS transistor in output stage 700, and a switch stage 600 for stopping the operation of VBL generating circuit during a device evaluation test.

Reference stage 500 includes resistance elements 100 and 101, an N-channel MOS transistor 201, and a P-channel MOS transistor 202.

Resistance element 100 is connected between a power-supply node VDD and N-channel MOS transistor 201. Moreover, resistance element 101 is connected in series between P-channel MOS transistor 202 and a ground node 300. A source of N-channel MOS transistor 201 is connected to a source of P-channel MOS transistor 202. N-channel MOS transistor 201 and P-channel MOS transistor 202 are diode-connected, respectively.

Output stage 700 includes an N-channel MOS transistor 209 and a P-channel MOS transistor 210.

N-channel MOS transistor 209 has a drain connected to the power-supply node VDD and a gate connected via the switch stage 600 to be described below to a node A1 which is a portion connecting N-channel MOS transistor 201 and resistance element 100 in reference stage 500. A source of N-channel MOS transistor 209 is connected to a source of P-channel MOS transistor 210.

On the other hand, a gate of P-channel MOS transistor 210 is connected via switch stage 600 to be described below to a node A3 which is a portion connecting P-channel MOS transistor 202 and resistance element 101 within reference stage 500. A source of P-channel MOS transistor 210 is connected to the ground node 300.

A pad 400 is a pad used during the device evaluation test, and is connected to an output node B1 which is a portion connecting N-channel MOS transistor 209 and P-channel MOS transistor 210.

Switch stage 600 includes N-channel MOS transistors 204, 205, and 207, and P-channel MOS transistors 203, 206, and 208.

P-channel MOS transistor 203 and N-channel MOS transistor 204 function as a transfer gate, and are connected between node A1 in reference stage 500 and a gate of N-channel MOS transistor 209 in output stage 700. In addition, N-channel MOS transistor 205 and P-channel MOS transistor 206 similarly function as a transfer gate, and are connected between node A3 in reference stage 500 and a gate of P-channel MOS transistor 210 in output stage 700. Moreover, N-channel MOS transistor 207 has a drain connected to the gate of N-channel MOS transistor 209 in output stage 700 and a source connected to a ground node 300. P-channel MOS transistor 208 has a drain connected to the gate of P-channel MOS transistor 210 in output stage 700 and a source connected to a power-supply node VDD.

Test signals TE and /TE are input from outside a VBL generating circuit 800 to gates of the respective MOS transistors in switch stage 600.

An operation of VBL generating circuit 800 having the above-described arrangement will be described below.

First of all, of the operations of VBL generating circuit, a normal operation, i.e., when test signals TE and /TE input to gates of the respective MOS transistors in switch stage 600 are inactive, will be described.

When a sum of a resistance value of N-channel MOS transistor 201 and a resistance value of resistance element 100 is set to be equal to a sum of a resistance value of P-channel MOS transistor 202 and a resistance value of resistance element 101, a potential at a reference node A2 becomes VDD/2 due to resistance division. Consequently, if a threshold voltage of N-channel MOS transistor 209 and a threshold voltage of P-channel MOS transistor 210 in output stage 700 respectively are $V_{thn}$ and $V_{thp}$, a gate voltage of N-channel MOS transistor 209 and a gate voltage of P-channel MOS transistor 210 respectively become $VDD/2+V_{thn}$ and $VDD/2-V_{thp}$, so that an output voltage of output node B1 is stabilized at VDD/2 (hereinafter referred to as VBL). Bit line reference potential VBL output from output node B1 is supplied to a bit line pair BL and /BL via an equalizer.

Next, an operation during device evaluation test, i.e., when test signals TE and /TE input to gates of the respective MOS transistors in switch stage 600 are active, will be described.

During a device evaluation test, an activated test signal /TE is input to gates of N-channel MOS transistors 204 and 205 in switch stage 600 and an activated test signal TE is input to gates of P-channel MOS transistors 203 and 206 so that these MOS transistors are all turned off. Moreover, activated test signal TE is input to a gate of N-channel MOS transistor 207 and activated test signal /TE is input to a gate of P-channel MOS transistor 208 so that N-channel MOS transistor 207 and P-channel MOS transistor 208 are turned on. As a result, the connection between reference stage 500 and output stage 700 is completely shut off, and VBL generating circuit 800 stops its operation.

During a device evaluation test, the operation of VBL generating circuit 800 is stopped by activating test signals TE and /TE as described above, and thereafter, output node B1 and a tester driver is connected via pad 400 and a desired bit line reference potential VBL level is driven from the tester driver.

In VBL generating circuit 800 having such circuit arrangement, however, when a desired bit line reference potential VBL level is driven directly from the tester driver via pad 400 during the device evaluation test, the current consumption is so large in the memory cell array to which bit line reference potential VBL is supplied that a tester driver with poor ability to control cannot drive the desired bit line reference potential VBL level, which limits the range of tester drivers that can be used.

SUMMARY OF THE INVENTION

An object of the present invention is to provide a semiconductor memory device that is capable of stably controlling a bit line reference potential VBL level regardless of the drivability of a tester driver during a device evaluation test.

According to the present invention, a semiconductor memory device capable of conducting a device evaluation test includes a memory cell array having a plurality of memory cells, and an intermediate voltage generating circuit for generating an intermediate voltage to be supplied to the memory cell array, where the intermediate voltage generating circuit includes an output stage having a first transistor connected between an output node and a power-supply node and a second transistor connected between the output node and a ground node, a reference stage having a first reference voltage generating circuit connected between a reference node and a power-supply node for generating a first reference voltage that is higher than a voltage of the reference node and that is to be supplied to a control electrode of the first transistor and a second reference voltage generating circuit connected between the reference node and a ground node for generating a second reference voltage that is lower than a voltage of the reference node and that is to be supplied to a control electrode of the second transistor, and a pad connected to the reference node for receiving a voltage supplied from outside during the device evaluation test.

Further, the first reference voltage generating circuit preferably includes a diode-connected N-channel MOS transistor, and the second reference voltage generating circuit preferably includes a diode-connected P-channel MOS transistor.

More preferably, the reference stage includes a transfer gate that is connected between the reference node and the pad and that is turned on in response to a test signal supplied from outside.

Thus, by controlling a reference node of the reference stage having a small current consumption with a tester driver via a pad, it becomes possible to stabilize the bit line reference potential VBL level without being influenced by the drivability of the tester driver.

More preferably, the reference stage includes a first through current control circuit connected between the first reference voltage generating circuit and the power-supply node and a second through current control circuit connected between the second reference voltage generating circuit and a ground node, the first through current control circuit includes a third transistor that has a first channel resistance and that is turned off in response to a test signal and a fourth transistor that has a second channel resistance higher than the first channel resistance and that is turned on in response to a test signal, and the second through current control circuit includes a fifth transistor that has a first channel resistance and that is turned off in response to a test signal and a sixth transistor that has a second channel resistance higher than the first channel resistance and that is turned on in response to a test signal.

Thus, a through current that flows through the reference stage during the device evaluation test can be made smaller than that during a normal operation, and a potential of the reference node of the reference stage can be controlled more easily by the tester driver.

More preferably, the reference stage includes a seventh transistor connected between the first reference voltage generating circuit and a power-supply node and having a control electrode connected to an output node and an eighth transistor connected between the second reference voltage generating circuit and a ground node and having a control electrode connected to an output node.

Thus, even in a case of an intermediate voltage generating circuit having a feedback function, by controlling the potential of a reference node of the reference stage during the device evaluation test, it becomes possible to stabilize the bit line reference potential VBL level without being influenced by the drivability of the tester driver. In addition, the feedback feature operates even during the device evaluation test so that a more stable bit line reference potential VBL can be supplied.

More preferably, the output stage includes a current mirror circuit formed by a plurality of transistors.

Thus, even with an intermediate voltage generating circuit including a current mirror circuit in the output stage, by controlling a potential of the reference node with a tester driver via a pad during the device evaluation test, it becomes possible to stabilize the bit line reference potential VBL level without being influenced by the drivability of the tester driver.

According to the present invention, it becomes possible to provide a semiconductor memory device capable of stabilizing a bit line reference potential VBL level without being influenced by the drivability of a tester driver by applying from outside with a tester a voltage to a reference node within a reference stage having a small current consumption during a device evaluation test in an intermediate voltage generating circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
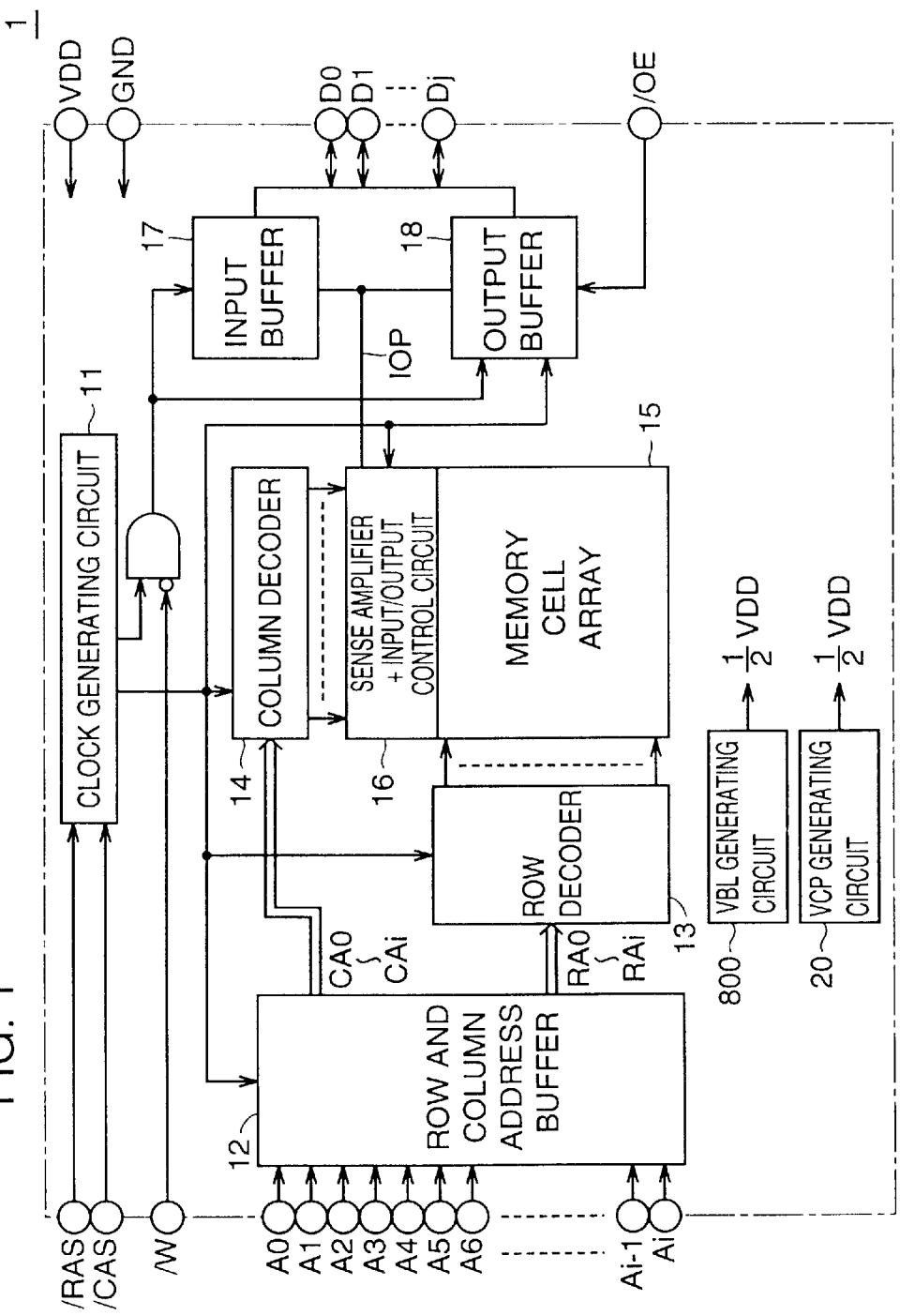
FIG. 1 is a block schematic diagram showing an overall arrangement of a semiconductor memory device according to an embodiment of the present invention.

The embodiments of the present invention will be described in detail below with reference to the drawings. Moreover, throughout the drawings, the same or corresponding parts are denoted by the same reference characters, and the descriptions thereof will not be repeated.

First Embodiment

FIG. 1 is a block schematic diagram showing an overall arrangement of a semiconductor memory device according to an embodiment of the present invention.

As shown in FIG. 1, a semiconductor memory device 1 includes a clock generating circuit 11, a row and column address buffer 12, a row decoder 13, a column decoder 14, a memory cell array 15, a sense amplifier+input/output control circuit 16, an input buffer 17, and an output buffer 18.

Clock generating circuit 11 selects a prescribed operation mode according to external control signals /RAS and /CAS and controls the entire semiconductor memory device 1.

Row and column address buffer 12 generates row address signals RA0 to RAi and column address signals CA0 to CAi according to external address signals A0 to Ai (where i is an integer greater than or equal to 0), and supplies the generated row address signals RA0 to RAi and column address signals CA0 to CAi respectively to row decoder 13 and column decoder 14.

Memory cell array 15 includes a plurality of memory cells, each of which storing a bit of data. Each memory cell is arranged at a prescribed address determined by a row address and a column address.

Row decoder 13 designates a row address of memory cell array 15 according to row address signals RA0 to RAi provided from row and column address buffer 12. Column decoder 14 designates a column address of memory cell array 15 according to column address signals CA0 to CAi provided from row and column address buffer 12.

Sense amplifier+input/output control circuit 16 connects a memory cell of an address designated by row decoder 13 and column decoder 14 to one end of a data input/output line pair IOP. The other end of data input/output line pair IOP is connected to input buffer 17 and output buffer 18. During a write mode, in response to an external control signal /W, input buffer 17 supplies data D0 to Dj (where j is an integer greater than or equal to 0) input from outside to the selected memory cell via data input/output line pair IOP. During a read mode, in response to an external control signal /OE, output buffer 18 outputs read data from the selected memory cell to outside.

VBL generating circuit 800 is a circuit for supplying a bit line reference potential VBL to a bit line pair BL and /BL described below in memory cell array 15.

In addition, a cell plate potential (hereinafter referred to as VCP) generating circuit 20 is a circuit for supplying a constant potential VCP (=VDD/2) to memory cells described below in memory cell array 15.

Figure 2:
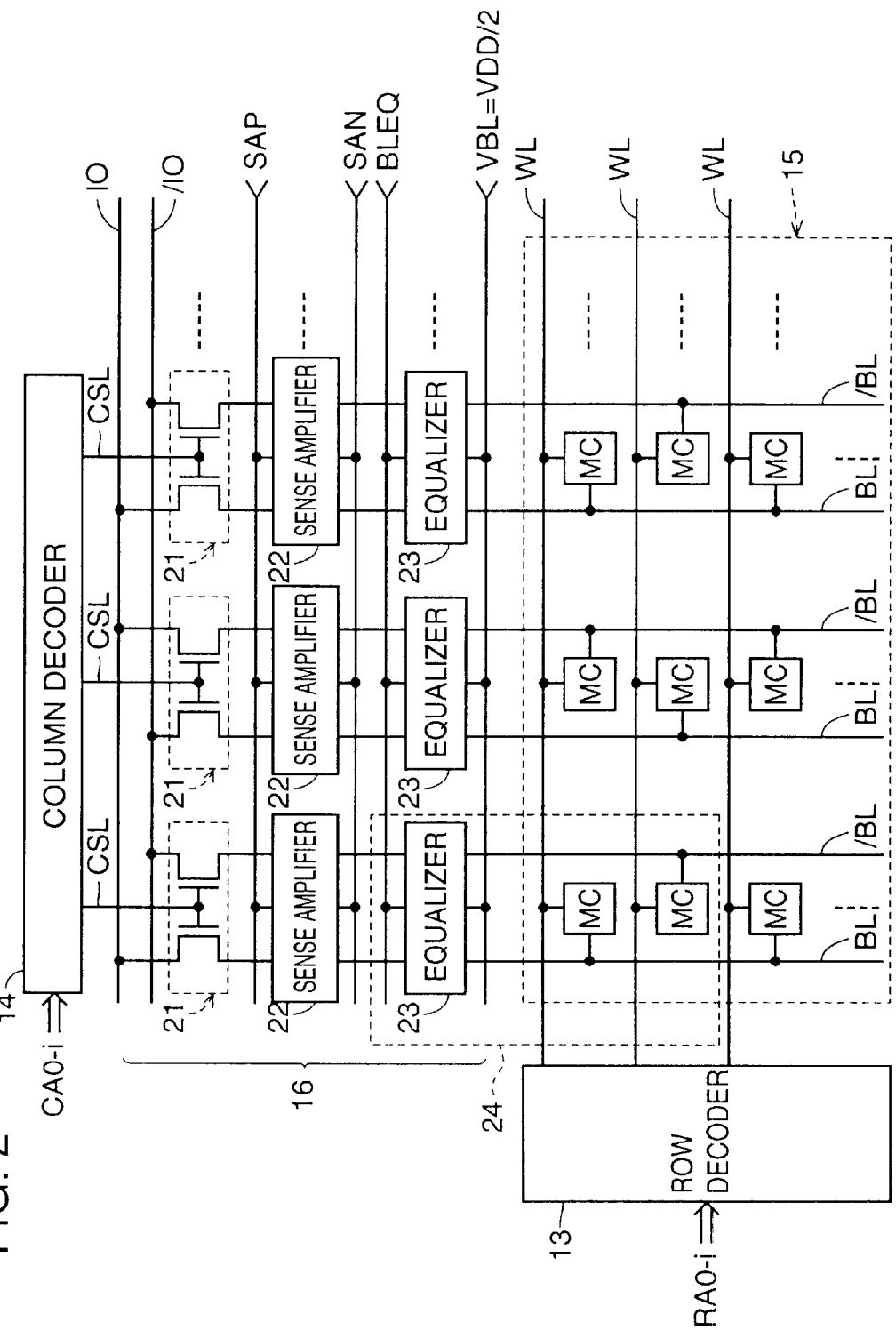
FIG. 2 is a block diagram representing an arrangement of a memory cell array 15 and a sense amplifier+input/output control circuit 16 in the semiconductor memory device shown in FIG. 1.
Figure 3:
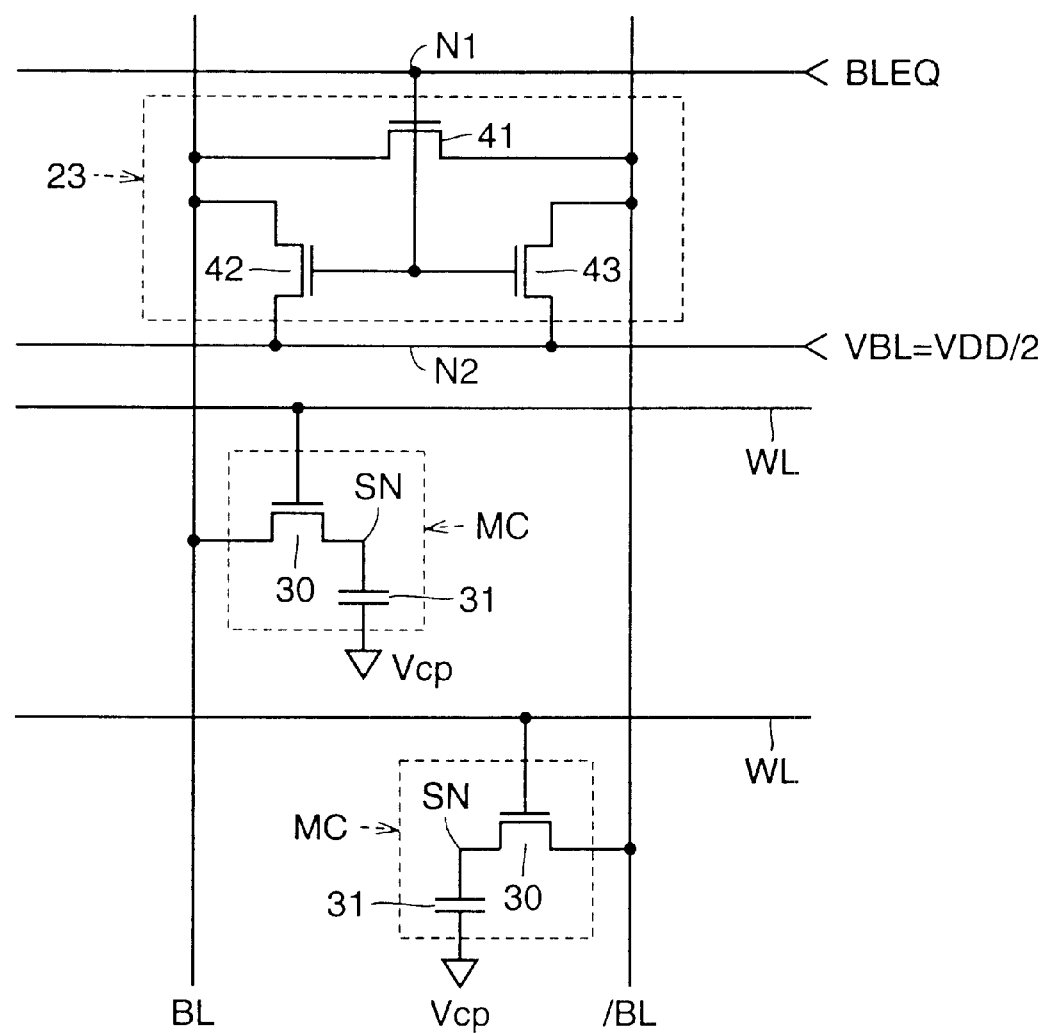
FIG. 3 is a circuit diagram illustrating an arrangement of a region 24 in FIG. 2 in detail.

FIG. 2 is a block diagram representing an arrangement of memory cell array 15 and sense amplifier+input/output control circuit 16 in the semiconductor memory device shown in FIG. 1. In addition, FIG. 3 is a circuit diagram illustrating in detail the arrangement of a region 24 in FIG. 2.

As shown in FIG. 2, memory cell array 15 includes a plurality of memory cells MC arranged in a matrix of rows and columns, a word line WL provided corresponding to each row, and a bit line pair BL and /BL provided corresponding to each column.

Each memory cell MC is connected to a word line WL of a corresponding row. A plurality of memory cells MC in odd-numbered columns are alternately connected to a bit line BL or to a bit line /BL, respectively. On the other hand, a plurality of memory cells MC in even-numbered columns are alternately connected to a bit line /BL or to a bit line BL, respectively.

Sense amplifier+input/output control circuit 16 includes a column select gate 21, a sense amplifier 22, and an equalizer 23 provided corresponding to each column. Column select gate 21 couples bit line pair BL and /BL with data input/output line pair IO and /IO when a column select line CSL is activated, or is caused to attain the H (logic high) level, by column decoder 14.

Sense amplifier 22 amplifies the small potential difference ΔV between bit lines BL and /BL to a power-supply voltage VDD in response to sense amplifier activating signals SAP and SAN output from clock generating circuit 11 respectively attaining the H level and the logic low or L level.

As shown in FIG. 3, each memory cell MC includes an accessing N-channel MOS transistor 30 and a capacitor 31 for storing information. A gate of N-channel MOS transistor 30 in each memory cell MC is connected to a word line WL of a corresponding row. N-channel MOS transistor 30 is connected between a bit line BL or /BL of a corresponding column and one electrode (storage node SN) of capacitor 31 of the same memory cell MC. The other electrode of capacitor 31 in each memory cell MC receives a cell plate potential VCP from previously described cell plate potential generating circuit 20. Word line WL transmits an output of row decoder 13 to select a memory cell MC into which a data signal is input and from which a data signal is output.

Equalizer 23 includes an N-channel MOS transistor 41 connected between bit lines BL and /BL and N-channel MOS transistors 42 and 43 respectively connected between bit lines BL and /BL and a node N2. Gates of N-channel MOS transistors 41 to 43 are all connected to a node N1. Node N1 receives a bit line equalizing signal BLEQ, and node N2 receives a bit line reference potential VBL (=VDD/2) from VBL generating circuit 800. Equalizer 23 equalizes potentials of bit lines BL and /BL to bit line reference potential VBL supplied from VBL generating circuit 800 in response to bit line equalizing signal BLEQ attaining the active state.

Figure 4:
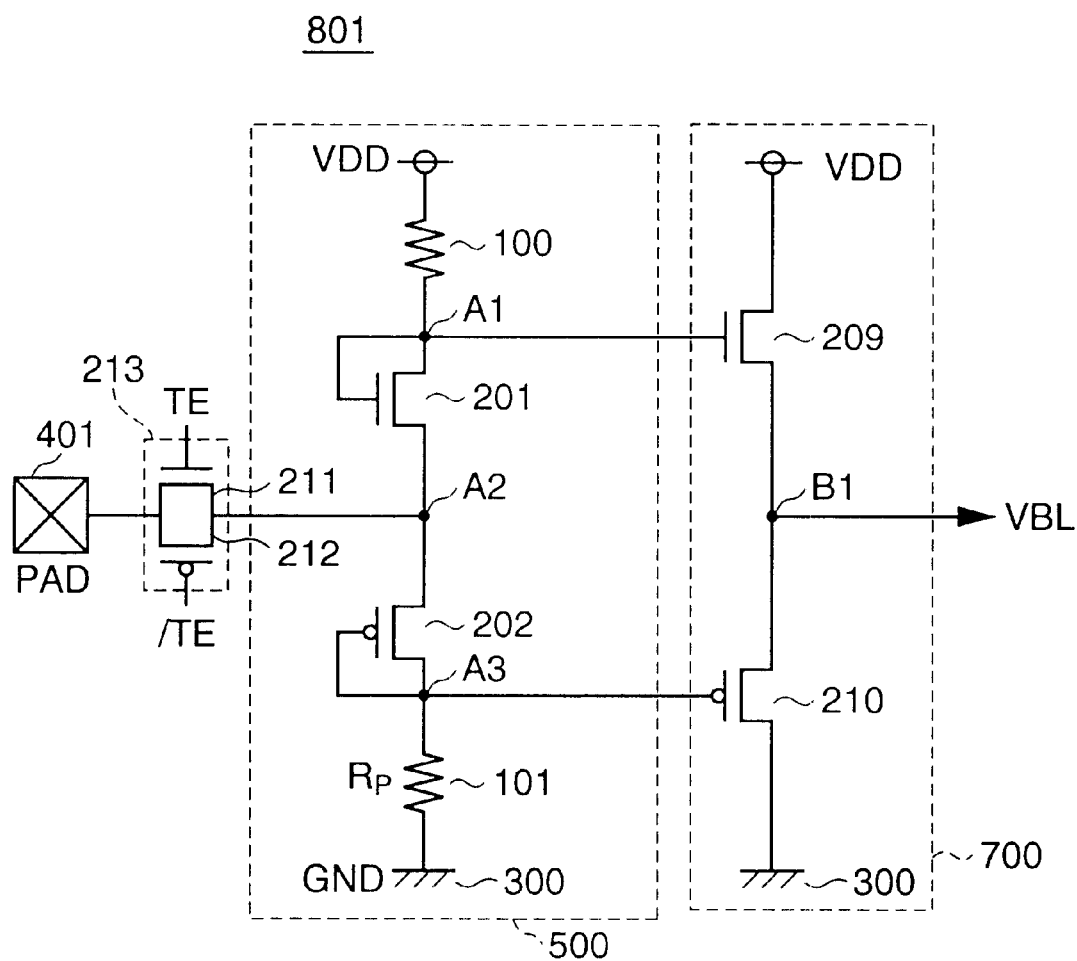
FIGS. 4 to 7 are circuit diagrams of a VBL generating circuit according to first to fourth embodiments of the present invention, respectively.

FIG. 4 is a circuit diagram of a VBL generating circuit according to the first embodiment of the present invention.

Figure 9:
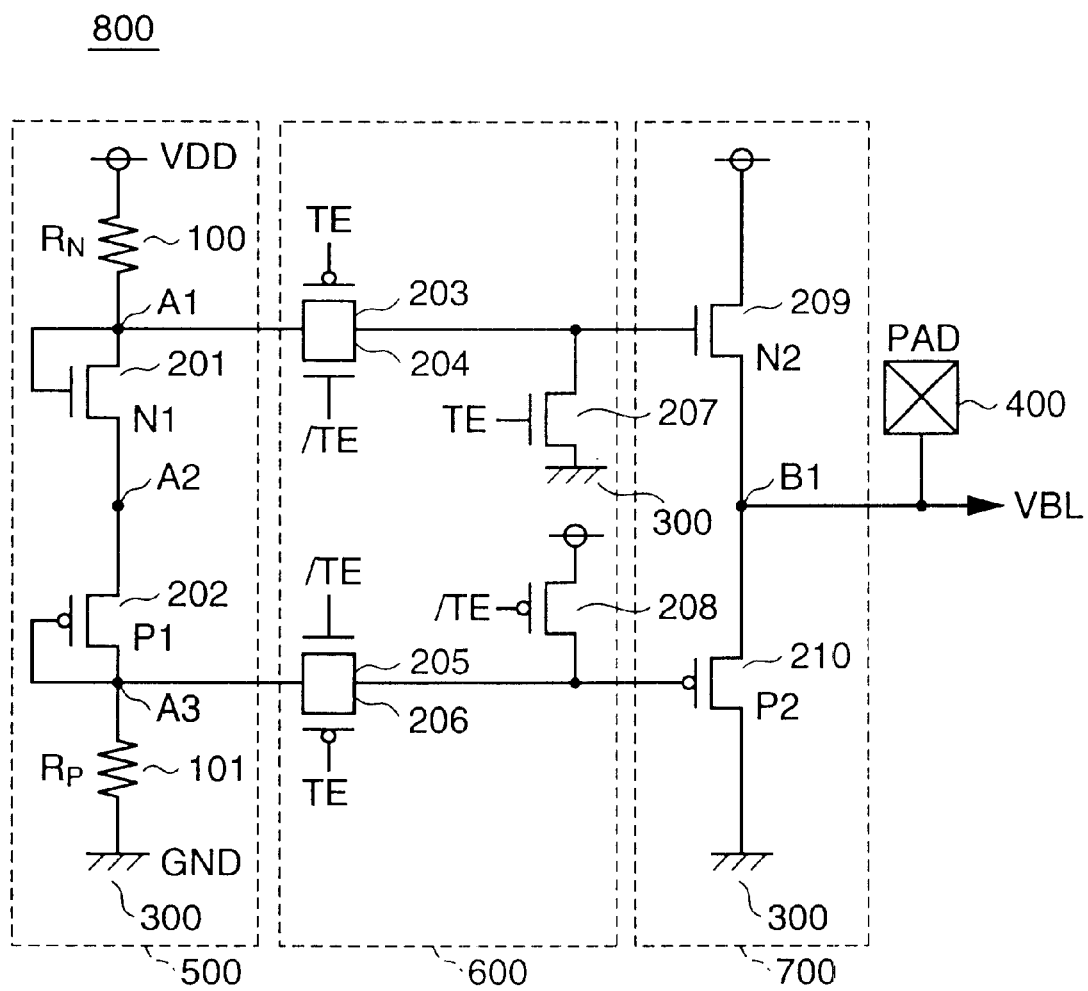
FIG. 9 is a circuit diagram of a conventional VBL generating circuit.

When compared with FIG. 9 which is a circuit diagram of a conventional VBL generating circuit 800, FIG. 4 shows a VBL generating circuit 801 according to the first embodiment that includes a reference stage 500 and an output stage 700 but not switch stage 600 of FIG. 9. A gate of an N-channel MOS transistor 209 in output stage 700 is connected to a node A1 in reference stage 500, and a gate of a P-channel MOS transistor 210 in output stage 700 is connected to a node A3 in reference stage 500.

Moreover, instead of pad 400 connected to output node B1 in FIG. 9, a pad 401 for connecting a tester driver during a device evaluation test is connected to a reference node A2 which is a portion connecting an N-channel MOS transistor 201 and a P-channel MOS transistor 202 via a transfer gate 213 in FIG. 4. Transfer gate 213 is formed by an N-channel MOS transistor 211 and a P-channel MOS transistor 212, and a test signal TE or /TE is input to a gate of each MOS transistor. The circuit arrangement in other portions is the same as that of the conventional VBL generating circuit 800 so that the description thereof will not be repeated.

Now, an operation of VBL generating circuit 801 will be described.

During a normal operation, test signals TE and /TE input to gates of N-channel MOS transistor 211 and P-channel MOS transistor 212 in transfer gate 213 are inactive so that transfer gate 213 is turned off. Consequently, the connection between pad 401 and reference stage 500 is shut off. Other operations are the same as those of the conventional VBL generating circuit 800 during a normal operation so that the description thereof will not be repeated.

During a device evaluation test, test signals TE and /TE input to gates of N-channel MOS transistor 211 and P-channel MOS transistor 212 in transfer gate 213 attain the active state so that transfer gate 213 is turned on. Consequently, it becomes possible to control the potential of reference node A2 with a tester driver via pad 401. In other words, when the tester driver applies a bit line reference potential VBL to reference node A2 via pad 401, if a threshold voltage of N-channel MOS transistor 209 and a threshold voltage of P-channel MOS transistor 210 in output stage 700 of VBL generating circuit 801 are $V_{thn}$ and $V_{thp}$, respectively, a gate voltage of N-channel MOS transistor 209 and a gate voltage of P-channel MOS transistor 210 respectively become VBL+$V_{thn}$ and VBL−$V_{thp}$, so that an output voltage of output node B1 is stabilized at bit line reference potential VBL.

Here, reference stage 500 serves to supply a voltage for turning on N-channel MOS transistor 209 and P-channel MOS transistor 210 in output stage 700. Therefore, reference stage 500 need not supply a current to output stage 700, and as a result, the consumed current in reference stage 500 can be made small. Thus, tester drivers that can be used are limited since output node B1 of output stage 700 with large current consumption must be controlled in the conventional VBL generating circuit 800; however, by controlling with the tester driver via pad 401 reference node A2 in reference stage 500 with small current consumption, it becomes possible to stabilize the bit line reference potential VBL level without being influenced by the drivability of the tester driver.

Moreover, the same circuit arrangement as VBL generating circuit 801 can be utilized for VCP generating circuit 20 that is an intermediate voltage generating circuit which is an equivalent of the VBL generating circuit in order to achieve the same effects.

Second Embodiment

Although an embodiment of the present invention has been described above, the present invention is not limited to the above-described embodiment and can be made and used in other embodiments as well.

Figure 5:
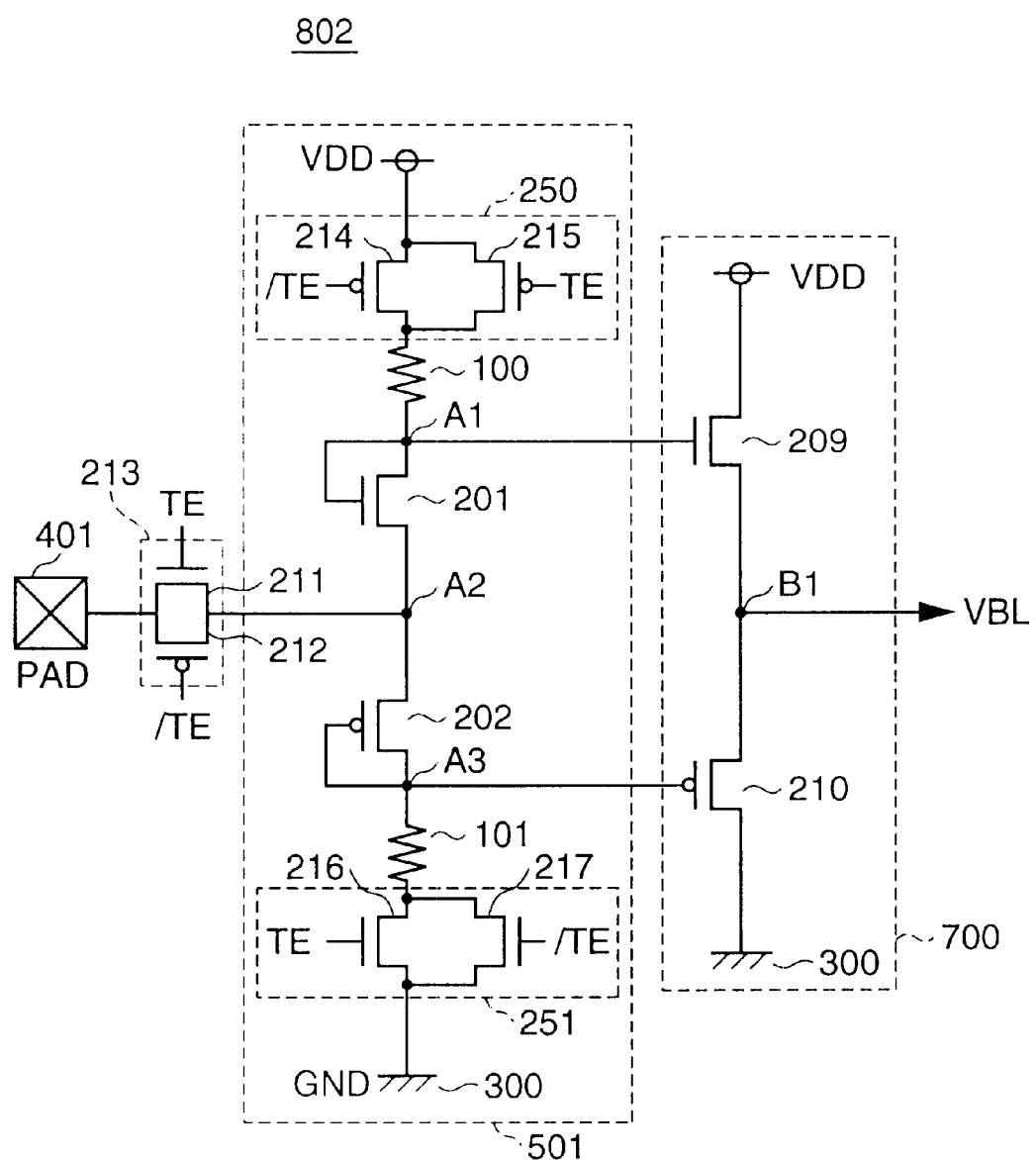

FIG. 5 is a circuit diagram of a VBL generating circuit according to the second embodiment of the present invention.

In comparison with reference stage 500 of VBL generating circuit 801 shown in FIG. 4, a reference stage 501 of a VBL generating circuit 802 in FIG. 5 additionally includes a through current control portion 250 formed by P-channel MOS transistors 214 and 215 and a through current control portion 251 formed by N-channel MOS transistors 216 and 217.

P-channel MOS transistor 214 in through current control portion 250 has a source connected to a power-supply node VDD and a drain connected to a resistance element 100. In addition, P-channel MOS transistor 215 also has a source connected to power-supply node VDD and a drain connected to resistance element 100.

N-channel MOS transistor 216 in through current control portion 251 has a drain connected to a resistance element 101 and a source connected to a ground node 300. In addition, like N-channel MOS transistor 216, N-channel MOS transistor 217 has a drain and a source connected to resistance element 101 and ground node 300, respectively.

A test signal TE or /TE is input to the respective gates of P-channel MOS transistors 214 and 215 in through current control portion 250 and N-channel MOS transistors 216 and 217 in through current control portion 251.

Here, a channel resistance value of P-channel MOS transistor 214 is set to be greater than a channel resistance value of P-channel MOS transistor 215, while a channel resistance value of N-channel MOS transistor 216 is set to be greater than a channel resistance value of N-channel MOS transistor 217.

The circuit arrangement in other portions is the same as that of VBL generating circuit 801 shown in FIG. 4 so that the description thereof will not be repeated.

Now, an operation of VBL generating circuit 802 will be described.

During a normal operation, a test signal TE input to gates of P-channel MOS transistor 215 and N-channel MOS transistor 216 and a test signal /TE input to gates of P-channel MOS transistor 214 and N-channel MOS transistor 217 attain the inactive state so that P-channel MOS transistor 215 and N-channel MOS transistor 217 are turned on and a through current flows through reference stage 501. The succeeding operation is the same as that of VBL generating circuit 801 shown in FIG. 4 so that the description thereof will not be repeated.

Next, during a device evaluation test, test signal TE input to gates of P-channel MOS transistor 215 and N-channel MOS transistor 216 and test signal /TE input to gates of P-channel MOS transistor 214 and N-channel MOS transistor 217 attain the active state so that P-channel MOS transistor 214 and N-channel MOS transistor 216 are turned on, while P-channel MOS transistor 215 and N-channel MOS transistor 217 are turned off. Since the channel resistance value of P-channel MOS transistor 214 is set to be greater than the channel resistance value of P-channel MOS transistor 215, and the channel resistance value of N-channel MOS transistor 216 is set to be greater than the channel resistance value of N-channel MOS transistor 217, the through current of reference stage 501 during the device evaluation test is reduced in comparison to that of the normal operation.

From the above-described operation, in VBL generating circuit 802, the through current that flows through reference stage 501 during the device evaluation test is made smaller than that during the normal operation, thereby allowing a potential of reference node A2 in reference stage 501 to be more easily controlled by a tester driver.

Moreover, the same circuit arrangement as VBL generating circuit 802 can be utilized for VCP generating circuit 20 that is an intermediate voltage generating circuit which is an equivalent of the VBL generating circuit in order to achieve the same effects.

Third Embodiment

Figure 6:
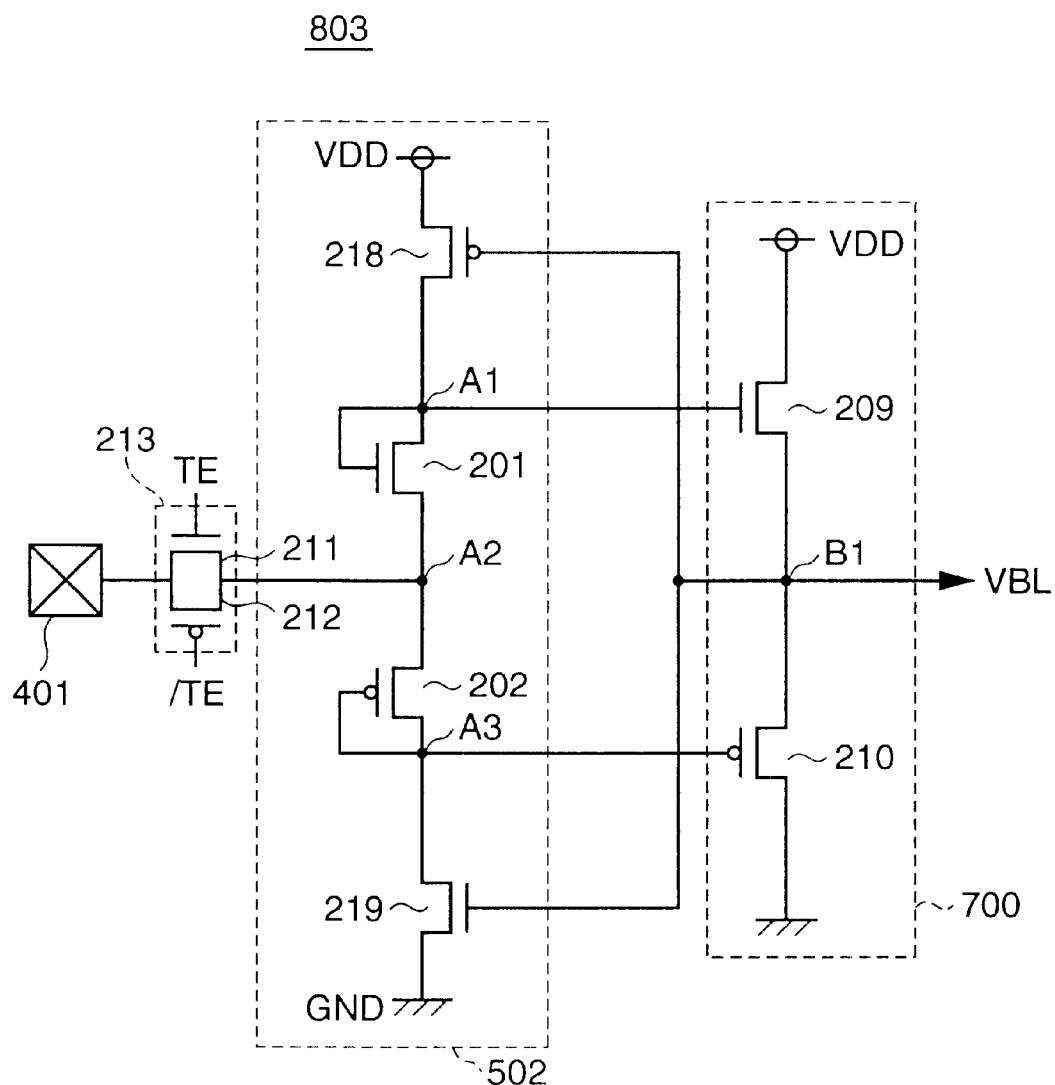

FIG. 6 is a circuit diagram of a VBL generating circuit according to the third embodiment of the present invention.

In comparison with reference stage 500 of VBL generating circuit 801 shown in FIG. 4, in a reference stage 502 of a VBL generating circuit 803 in FIG. 6, a P-channel MOS transistor 218 is disposed in place of resistance element 100 in FIG. 4 and an N-channel MOS transistor 219 is disposed in place of resistance element 101 in FIG. 4, respectively. Gates of P-channel MOS transistor 218 and N-channel MOS transistor 219 are both connected to an output node B1 in an output stage 700.

The circuit arrangement in other portions is the same as that of VBL generating circuit 801 shown in FIG. 4 so that the description thereof will not be repeated.

In VBL generating circuit 803 having the above-described circuit arrangement, a bit line reference potential VBL level of output node B1 in output stage 700 is feedback to P-channel MOS transistor 218 and N-channel MOS transistor 219 in reference stage 502 so as to improve the sensitivity to variation of bit line reference potential VBL at output node B. In other words, when bit line reference potential VBL of output node B1 becomes low, a gate voltage of P-channel MOS transistor 218 is also lowered such that the channel resistance value of P-channel MOS transistor 218 is lowered and a through current that flows through reference stage 502 increases. Thus, bit line reference potential VBL at reference node A2 increases, and according to the increase in potential at reference node A2, bit line reference potential VBL at output node B1 also increases.

Even in VBL generating circuit 803 having such feedback feature, it becomes possible to stabilize the bit line reference potential VBL level without being influenced by the drivability of a tester driver by having transfer gate 213 turned on by test signals TE and /TE during the device evaluation test and by controlling the potential of reference node A2 with the tester driver via pad 401. In addition, the feedback feature operates even during the device evaluation test so that a more stable bit line reference potential VBL can be supplied.

Moreover, the same circuit arrangement as VBL generating circuit 803 can be utilized for VCP generating circuit 20 that is an intermediate voltage generating circuit which is an equivalent of the VBL generating circuit in order to achieve the same effects.

Fourth Embodiment

Figure 7:
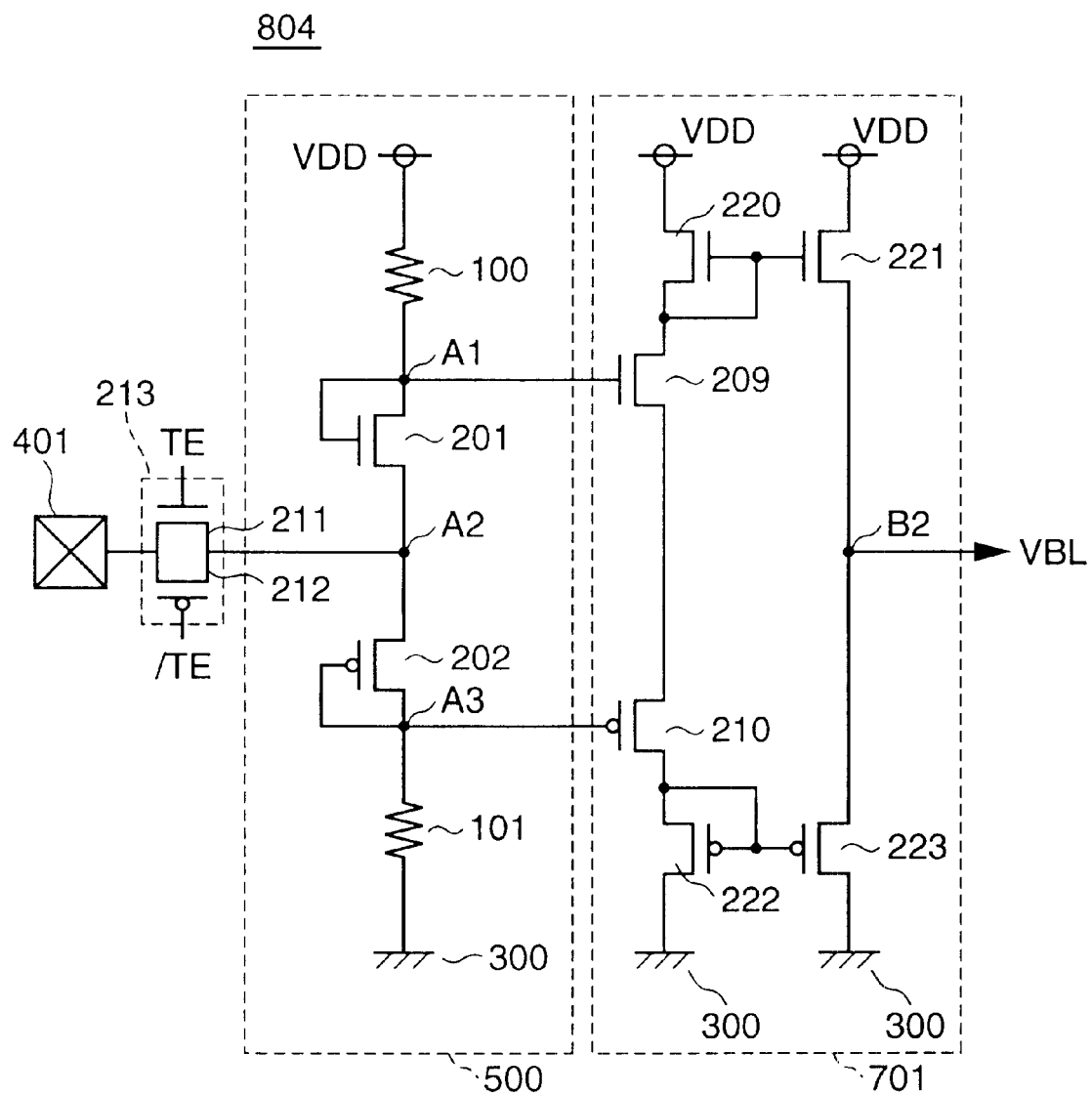

FIG. 7 is a circuit diagram of a VBL generating circuit according to the fourth embodiment of the present invention.

As shown in FIG. 7, a VBL generating circuit 804 includes a current mirror-type output stage 701.

In addition to N-channel MOS transistor 209 and P-channel MOS transistor 210 included in the conventional output stage 700, output stage 701 includes N-channel MOS transistors 220 and 221, and P-channel MOS transistors 222 and 223. N-channel MOS transistor 220 is connected between a power-supply node VDD and N-channel MOS transistor 209, and P-channel MOS transistor 222 is connected between P-channel MOS transistor 210 and a ground node 300. N-channel MOS transistor 220 and P-channel MOS transistor 222 are diode-connected, respectively.

On the other hand, N-channel MOS transistor 221 and P-channel MOS transistor 223 are connected in series, and a drain of N-channel MOS transistor 221 is connected to a power-supply node VDD, and a drain of P-channel MOS transistor 223 is connected a ground node 300, respectively. A gate of N-channel MOS transistor 221 is connected to a gate of N-channel MOS transistor 220, and a gate of P-channel MOS transistor 223 is connected to a gate of P-channel MOS transistor 222, respectively. A bit line reference potential VBL supplied from output stage 701 to an equalizer 23 is output from an output node B2 which is a portion connecting a source of N-channel MOS transistor 221 and a source of P-channel MOS transistor 223.

The circuit arrangement in other portions is the same as that of VBL generating circuit 801 shown in FIG. 4 so that the description thereof will not be repeated.

In VBL generating circuit 804 having such current mirror-type output stage 701 as described above, N-channel MOS transistor 221 and P-channel MOS transistor 223 function as constant current sources, allowing a stable current to be supplied.

Even in VBL generating circuit 804 having such current mirror-type output stage 701, it becomes possible to stabilize the bit line reference potential VBL level output from output node B2 without being influenced by the drivability of a tester driver by having transfer gate 213 turned on by test signals TE and /TE during a device evaluation test and by controlling the potential of reference node A2 with the tester driver via pad 401.

Figure 8:
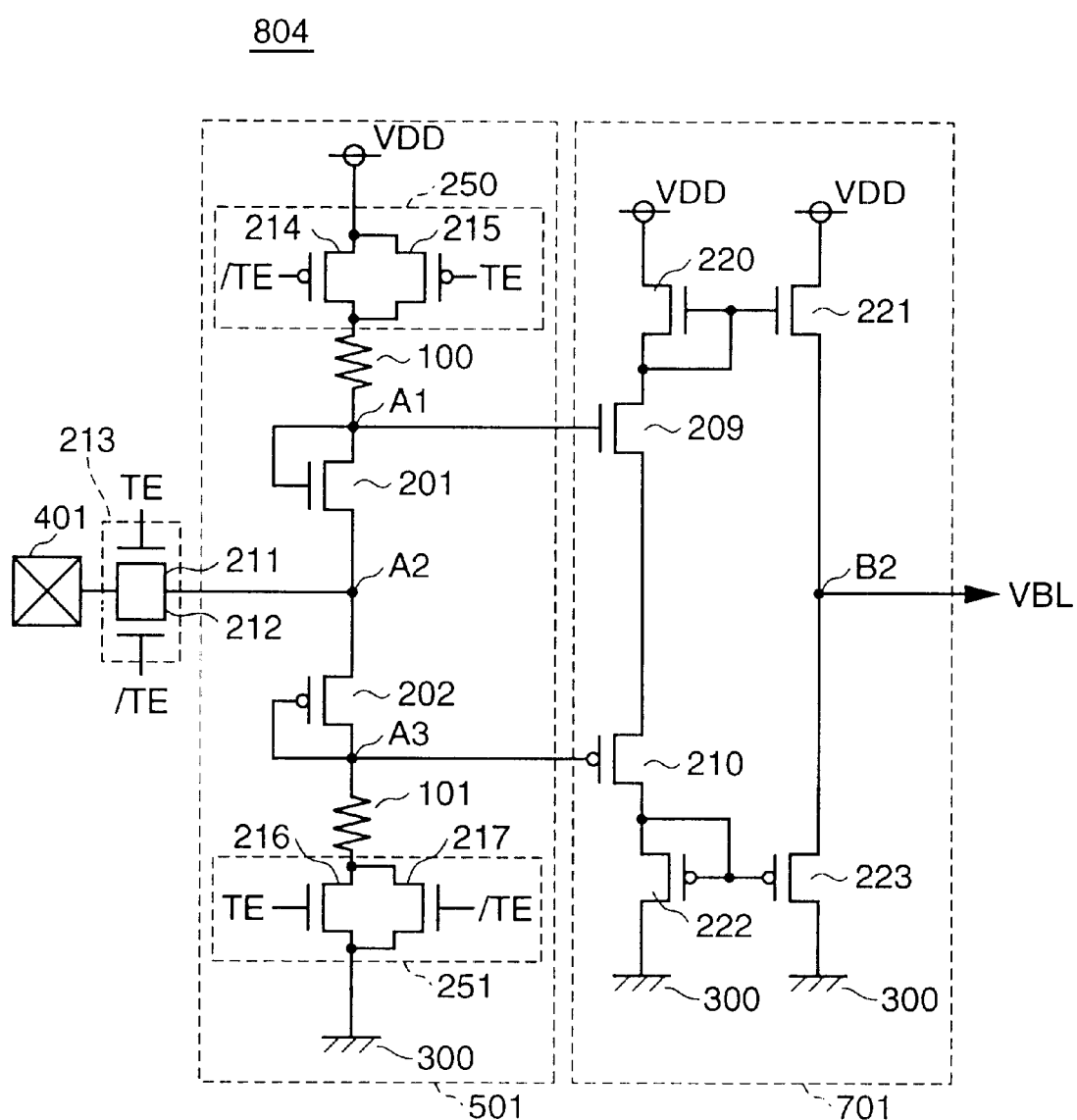
FIG. 8 is a circuit diagram showing another example of the VBL generating circuit shown in FIG. 7.

In addition, as shown in FIG. 8, reference stage 501 shown in FIG. 4 can be disposed in place of reference stage 500 of VBL generating circuit 804 in FIG. 7. In this case, it becomes possible to reduce the through current using test signals TE and /TE and to facilitate control of the potential of reference node A2 in reference stage 501 with a tester driver during a device evaluation test.

Moreover, the same circuit arrangement as VBL generating circuit 804 can be utilized for VCP generating circuit 20 that is an intermediate voltage generating circuit which is an equivalent of the VBL generating circuit in order to achieve the same effects.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device capable of conducting a device evaluation test, comprising:
    a memory cell array including a plurality of memory cells; and
    an intermediate voltage generating circuit for generating an intermediate voltage to be supplied to said memory cell array, wherein
        said intermediate voltage generating circuit includes
            an output stage including a first transistor connected between an output node and a power-supply node and a second transistor connected between said output node and a ground node,
            a reference stage including a first reference voltage generating circuit connected between a reference node and a power-supply node for generating a first reference voltage that is higher than a voltage of said reference node and that is to be supplied to a control electrode of said first transistor and a second reference voltage generating circuit connected between said reference node and a ground node for generating a second reference voltage that is lower than a voltage of said reference node and that is to be supplied to a control electrode of said second transistor, and
            a pad connected to said reference node for receiving a voltage externally supplied during said device evaluation test.

2. The semiconductor memory device according to claim 1, wherein
    said first reference voltage generating circuit includes a diode-connected N-channel MOS transistor, and
    said second reference voltage generating circuit includes a diode-connected P-channel MOS transistor.

3. The semiconductor memory device according to claim 1, wherein
    said reference stage further includes
        a transfer gate connected between said reference node and said pad and turned on in response to a test signal externally supplied.

4. The semiconductor memory device according to claim 3, wherein said reference stage further includes a first through current control circuit connected between said first reference voltage generating circuit and said power-supply node, a second through current control circuit connected between said second reference voltage generating circuit and said ground node, wherein said first through current control circuit includes a third transistor having a first channel resistance and turned off in response to said test signal, and a fourth transistor having a second channel resistance higher than said first channel resistance and turned on in response to said test signal, and wherein said second through current control circuit includes a fifth transistor having a first channel resistance and turned off in response to said test signal, and a sixth transistor having a second channel resistance higher than said first channel resistance and turned on in response to said test signal.

5. The semiconductor memory device according to claim 3, wherein said reference stage further includes a seventh transistor connected between said first reference voltage generating circuit and said power-supply node and having a control electrode connected to said output node, and an eighth transistor connected between said second reference voltage generating circuit and said ground node and having a control electrode connected to said output node.

6. The semiconductor memory device according to claim 3, wherein said output stage further includes a current mirror circuit formed by a plurality of transistors.

7. The semiconductor memory device according to claim 1, wherein said memory cell array further includes a bit line pair, and a precharge circuit connected to an output node of said intermediate voltage generating circuit for precharging said bit line pair to said intermediate voltage.

8. The semiconductor memory device according to claim 1 wherein each of said memory cells includes an access transistor, and a capacitor having plate connected to an output node of said intermediate voltage generating circuit, said capacitor being transistor.

* * * * *